United States Patent [19]

Kohl et al.

[11] Patent Number: 4,868,620

[45] Date of Patent: Sep. 19, 1989

[54] HIGH-VOLTAGE PULL-UP DEVICE

[75] Inventors: James E. Kohl, Schenectady, N.Y.;
Eric J. Wildi, Chapel Hill, N.C.;
Robert S. Scott, Schenectady, N.Y.;
Deva N. Pattanaya, Schenectady,
N.Y.; Michael S. Adler, Schenectady,
N.Y.

[73] Assignee: Pacific Bell, San Francisco, Calif.

[21] Appl. No.: 219,288

[22] Filed: Jul. 14, 1988

[51] Int. Cl.[4] ........................ H01L 29/80; H01L 29/78
[52] U.S. Cl. .............................. 357/23.12; 357/233;
357/23.4; 357/44
[58] Field of Search ................... 357/23.12, 23.4, 23.3,
357/41

[56] References Cited

U.S. PATENT DOCUMENTS 4,485,392 11/1984 Singer ............................. 357/23.12
4,611,220 9/1986 MacIver ........................... 357/23.12

OTHER PUBLICATIONS

D. Hodges and H. Jackson, "Analysis and Design of Digital Integrated Circuits", McGraw-Hill, NY, 1983, pg. 38.

Primary Examiner—William L. Sikes
Assistant Examiner—David Soltz
Attorney, Agent, or Firm—McCubbrey, Bartels, Meyer & Ward

[57] ABSTRACT

An integrated circuit in which a large potential can be maintained between the source of the device and the substrate on which this device and other devices are fabricated is described. The circuit employs a minority carrier sink region to remove minority carriers from the gate region of a MOS depletion device. The sink region is shielded from the substrate by a buried layer which prevents punch-through between the sink region and the substrate.

7 Claims, 3 Drawing Sheets

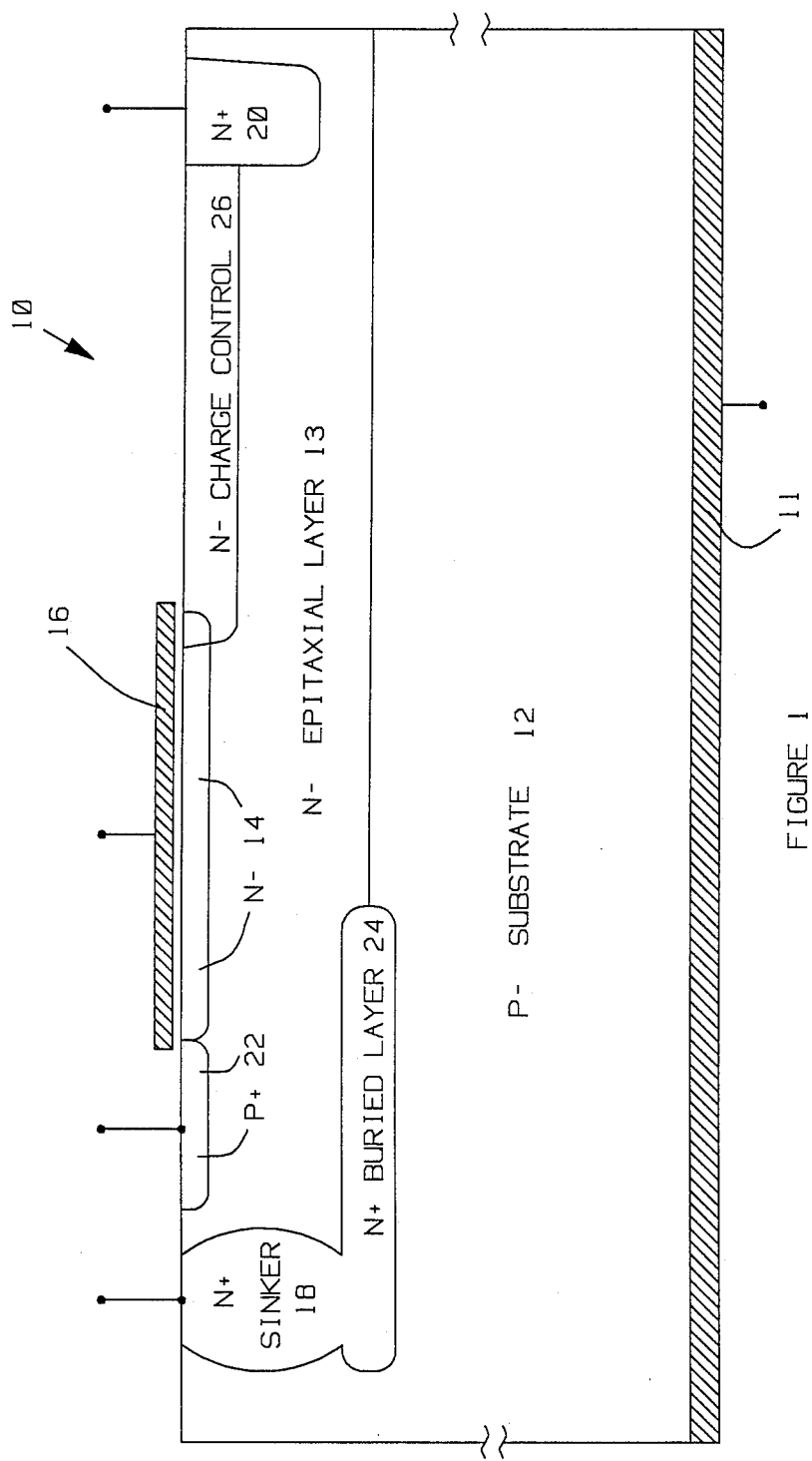

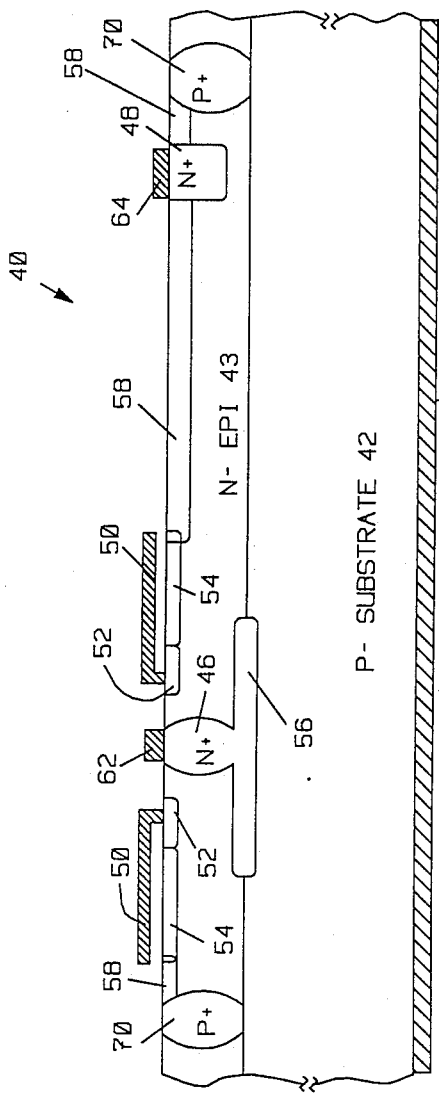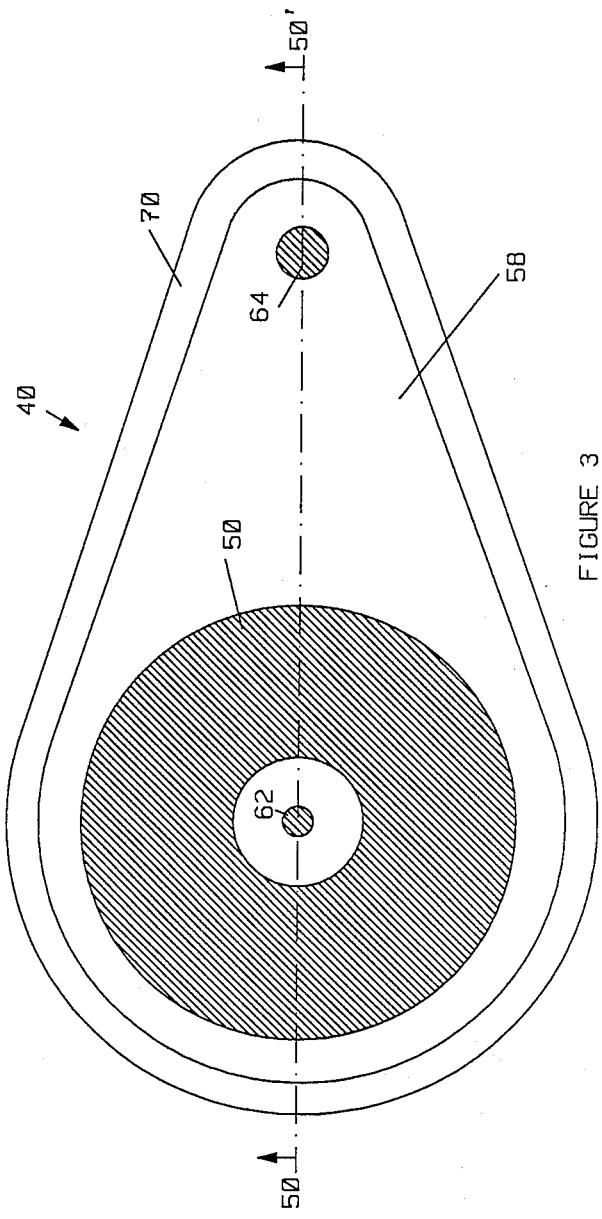

HIGH-VOLTAGE PULL-UP DEVICE

BACKGROUND

The present invention relates generally to high voltage integrated circuits and more specifically to high voltage pull-up devices which may be integrated into a monolithic chip having low voltage components thereon.

There are a number of applications in which a device which can actively drive the potential of a load terminal to a high positive supply value is needed. For example, such a device could be combined with an N-channel or NPN device to create a "push-pull" or "totem pole" output driver circuit. Such driving circuits would be particularly useful in running piezo-electric relays which require that driving potentials of the order of 400 volts be switched onto either of two electrodes in the relay.

Typically, high voltage lateral transistors are formed in an N type epitaxial layer on a lightly doped P substrate. An N+ emitter (or source) is diffused into a P base in one epitaxial region, and an N type collector is diffused into the epitaxial layer at a location which is spaced laterally from the base. Unfortunately, the technique is not well suited to circuit designs in which the source (or emitter) of the transistor is at a substantially different potential than the silicon substrate on which the transistor is constructed and more than one transistor is constructed on the substrate in question. For example, when a large potential is applied between the base of a transistor (or the gate of a FET) and the substrate in an NPN transistor constructed over a P substrate, an undesired current flows between these two regions. This phenomenon is referred to as "punch-through". In a pull-up device, the base of the transistor rises to the collector potential. Hence, a large potential difference between the base of the transistor and the substrate can not be avoided in such a device.

One solution to this problem is to use a depletion mode MOSFET. Since an N-channel depletion mode MOSFET constructed over a P— substrate does not contain a second P region, the punch-through problem described above is avoided. Unfortunately, such devices suffer from inversion layer shielding problems which lead to an inability to turn the device completely off. These problems are the result of a hole inversion layer which forms underneath the MOS gate at a low gate bias. This inversion layer limits the maximum width of the depletion layer that can be induced using a slowly-varying or DC gate bias.

In principle, the inversion layer effect may be overcome by the proper choice of channel implant and depth. However, the margin for error in this regard is so small that the device is difficult to manage at high yields. Furthermore, this solution limits the range of channel dopant densities which may be used. For a given set of channel dimensions, the "on" resistance of the pull-up device is determined by this dopant density. Hence, this solution is also undesirable because it results in devices which have significantly higher resistances in the "on" state.

Broadly, it is an object of the present invention to provide an improved high voltage pull-up device which can be fabricated on a common substrate with other circuit components.

It is a further object of the present invention to provide a pull-up device which does not suffer from the above mentioned inversion layer problem.

These and other objects of the present invention will become obvious to those skilled in the art from the following detailed description of the present invention and the accompanying drawings.

SUMMARY OF THE INVENTION

The present invention consists of an integrated circuit device in which a large potential can be maintained between the source of the device and the substrate on which this device and other devices are fabricated. The integrated circuit includes a substrate layer of a first conductivity type. A drift layer of an opposite conductivity type having a selected first charge density overlies the substrate layer. A buried layer of the opposite conductivity type is situated between the substrate and drift layers. A gate electrode is insulatingly spaced from the drift layer. A threshold implant region of the opposite conductivity type extends from the upper surface of the drift layer and underlies the gate electrode. A sink implant region of the first conductivity type is located adjacent to the gate and threshold implant region. The buried layer underlies the sink implant layer so as to prevent punch-through between the substrate layer and the sink implant region.

A source region of the opposite conductivity type extends from the upper surface of the drift layer to the buried layer, the sink implant region lying between the source region and the threshold implant region. The sink implant region is biased to a potential substantially equal to the potential of the gate electrode. The device also includes a drain region of the opposite conductivity type extending from an upper surface of the drift layer.

BRIEF DESCRIPTION OF THE DRAWINGS

FIG. 1 is a cross-sectional view of an integrated circuit according to the present invention.

FIG. 2 is a cross-sectional view of the preferred embodiment of the present invention.

FIG. 3 is top view of the integrated circuit shown in FIG. 2.

DETAILED DESCRIPTION OF THE INVENTION

Figure 4:
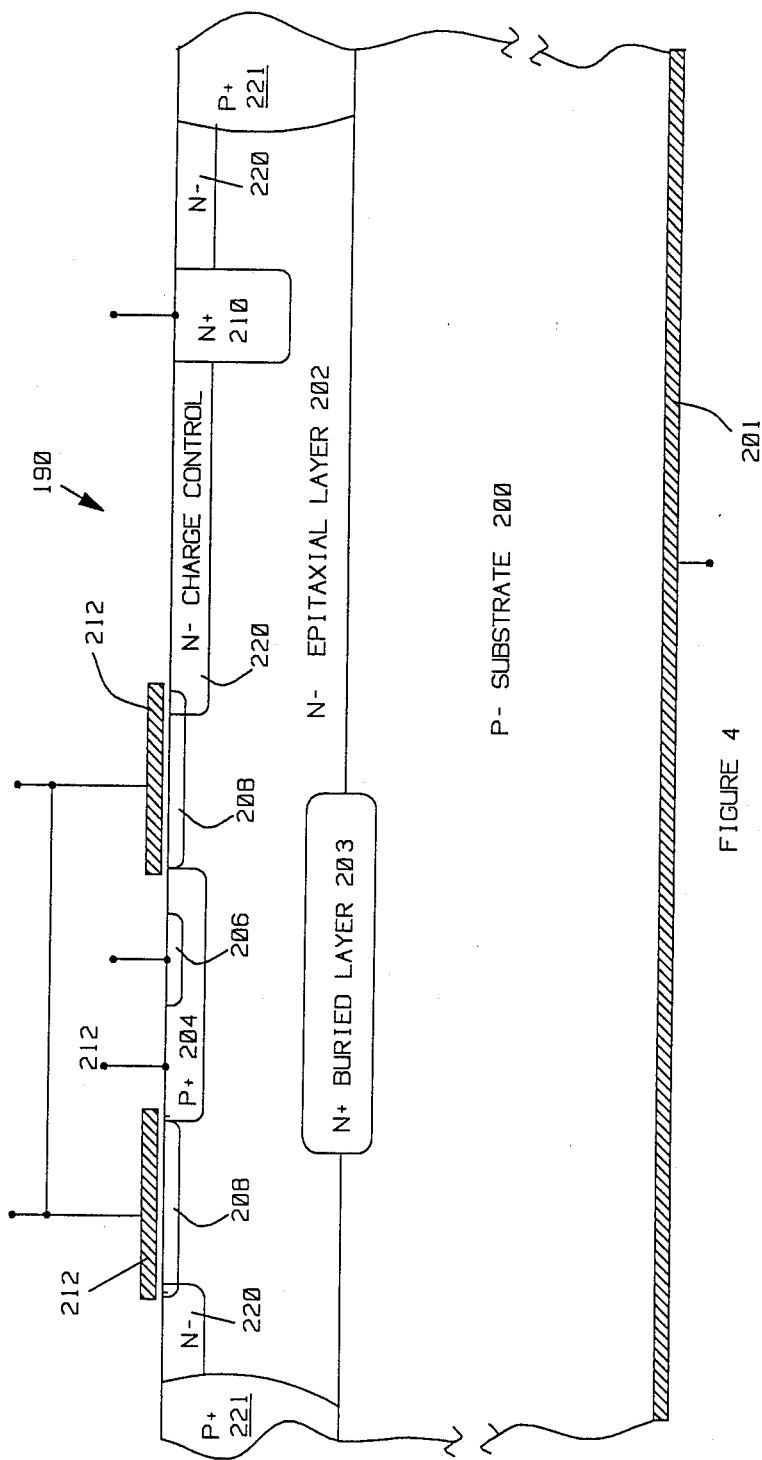
FIG. 4 is a cross-sectional view of another embodiment of the present invention.

A high voltage pull-up device which is compatible with existing high voltage transistors must meet two requirements. First, it must turn off when the source to gate voltage is of the order of 10 volts even with a source to drain voltage as high as 400 volts. Second, the device must remain "on" when the source, gate, and drain are all at about 400 volts above the substrate potential.

To meet these requirements, prior art depletion mode MOS FET's (Field Effect Transistors) must control the doping levels to within a very narrow range of values which limits their "on" state conductivity and reduces process yields. When the source to gate voltage is greater than the threshold voltage of a prior art depletion mode MOS FET, an inversion layer forms under the gate. This inversion layer is the result of minority carriers which accumulate under the gate. As a result of this inversion layer, further increases in source to gate voltage do not cause the gate channel to become nonconducting. Instead, the inversion layer shields the channel charge and the voltage now appears across the gate and the inversion layer.

The present invention avoids the accumulation of minority carriers under the gate by providing a "sink" for minority carriers. This is illustrated in FIG. 1 which is cross-sectional view of an N-channel MOS pull-up device according to the present invention. The pull-up device shown at 10 is constructed on a P− substrate 12, having an N− epitaxial drift layer 13 thereon. The substrate is biased via an electrode 11 coupled to the bottom surface thereof or via an electrode coupled to a P+ region which touches the substrate and the top surface. A potential applied to a gate electrode 16 controls the field in an implant region 14 underlying the gate. Electrode 16 is insulated from layer 13.

The threshold voltage of the device is determined by an arsenic implant in region 14. This arsenic implant is preferably $1 \times 10^{12}$ atoms/cm$^2$.

The source 18 and drain 20 are constructed from N+ implants. These implants are preferably $10^{20}$ phosphorous atoms/cc. The source and drain typically extend through drift layer 13 and into substrate 12 for a total depth of approximately 10 microns.

A P+ diffusion region 22 is adjacent to the gate region diffusion 16. The P+ diffusion 22 acts as a sink for the minority carriers which cause the inversion layer in the above mentioned prior art devices. Minority carriers which are produced in the region 14 are collected by region 22. As a result, the minority carriers which cause the inversion layer in prior art devices are eliminated. The P+ diffusion region is preferably constructed by doping a region of the drift layer with boron atoms to a density of $2 \times 10^{18}$ atoms/cc. The P+ diffusion region 22 is preferably held at a potential which is equal to or slightly more negative than the MOS gate 16.

To avoid punch-through between substrate 12 and P+ region 22, an N+ buried layer 24 is grown underneath P+ diffusion region 22 extending into P− substrate 12. N+ buried layer 24 is coupled to source 18 and effectively extends the source under P+ diffusion region 22. N+ buried layer 24 shields the P+ diffusion region 22 from substrate 12. This shielding prevents punch-through between substrate 12 and P+ diffusion region 22. N+ buried layer 24 is preferably doped to a density of approximately $10^{19}$ atoms/cc and is approximately 8 microns thick.

A conventional lateral charge control implant region 26 is provided between the drain and the gate. The lateral charge control implant is chosen so that the device can withstand 400 volts from drain to source as well as from drain to substrate. The lateral charge control implant region may be constructed by implanting an N type dopant to a concentration of about $1 \times 10^{12}$ atoms/cm$^2$. In devices which do not need to withstand such high voltages, the lateral charge control implant may be omitted.

Device 10 may be constructed in a radial geometry having an axis of rotation about region 18 or region 20. In the preferred embodiment, gate electrode 16, threshold implant region 14, P+ sink region 22, and buried layer 24 are circularly symmetric around the source 18. This is illustrated by the N-channel MOS pull-up device shown at 40 in FIGS. 2 and 3. FIG. 2 is a cross-sectional view of device 40 taken through line 50—50′ shown in FIG. 3. FIG. 3 is a top view of device 40.

Referring to FIG. 2, pull-up device 40 is constructed on a P− substrate 42 having an N− epitaxial drift layer 43 thereon. The source 46 and drain 48 are constructed from N+ implant regions. The source is accessed via electrode 62 and the drain is accessed via electrode 64. The gate of pull-up device 40 consists of an annular electrode 50 which overlies an N-threshold implant region 54. The gate electrode 50 is also coupled to a P+ sink region 52 which removes minority carriers from threshold implant region 54. Threshold implant region 54 and sink region 52 are also preferably symmetric about source 46.

An N+ buried layer 56 is coupled to source 46 and extends under the sink region 52 and partially under the threshold implant region 54. Buried layer 56 shields sink region 52 from substrate 42 and thus prevents punch-through between these regions. Buried layer 56 is also preferably symmetric about the source 46.

An N− lateral charge control region 58 connects the drain 48 and threshold implant region 54. Region 58 also connects the drain 48 and isolation region 70, as well as the threshold region 54 and the isolation region 70. As mentioned above, such regions are conventionally used to increase the voltage difference which may be maintained between gate and drain.

As mentioned above, the threshold region 54 and sink region 52 are preferably symmetric about source 46. That is, these regions form loops around source 46. This geometry ensures that all conduction paths between source and drain can be depleted by the MOS action of the gate.

Finally, pull-up device 40 is preferably isolated from other devices constructed on substrate 42 by a P+ region 70 which extends from the surface of drift region 43 to the substrate 42. Such isolation "trenches" are well known to the integrated circuit arts.

The principle of using a minority carrier charge sink protected from the substrate by a buried layer may be applied to other integrated circuit devices. For example, FIG. 4 illustrates a combination MOS-bipolar device 190 using this principle. Device 190 is functionally equivalent to a high voltage NPN transistor whose emitter can be floated to a high positive potential with respect to the substrate without punch-through from the base to the substrate occurring. Device 190 is constructed on a P− substrate 200 which includes an electrode 201 for biasing the same. Alternatively, substrate 200 may be biased by applying a potential to a P+ isolation region 221 which touches substrate 200. An N− epitaxial drift layer 202 overlies substrate 200.

The collector of the transistor is constructed from an N+ region 210 which is coupled to an N-threshold implant region 208 by an N− lateral charge control region 220. The field in threshold implant region 208 is controlled by a MOS gate electrode 212 which is insulatingly spaced above threshold implant region 208.

A P+ region 204 acts as the base of the NPN transistor and also as a sink for minority carriers from threshold implant region 208. Region 204 is shielded from substrate 200 by an N+ buried layer 203.

The emitter of the NPN transistor is formed from an N+ region 206 extending from the surface of drift layer 202 into region 204.

Device 190 operates as follows. The electrode connected to the emitter region 206 is tied to the gate electrode 212. If no current is forced into the base 204, then the device is off. If the collector, region 210, is held at a potential which is sufficiently more positive than the emitter, region 206, the buried layer 203 will be brought to a potential higher than the gate potential such that the threshold implant region 208 will be depleted of carriers. Once this occurs, the buried layer potential will not increase further. In this case, current will be blocked from flowing through the device.

Device 190 is turned on by forward biasing the base to emitter junction. This reduces the MOS gate 212 to buried layer 203 bias. As a result, electrons will flow from the buried layer 203 and the emitter region 206 to the collector, region 210.

Accordingly, an improved pull-up device which is capable of maintaining a large potential difference between the source or emitter thereof and the substrate on which said device is fabricated has been described. Various modifications to the present invention will become apparent to those skilled in the art from the foregoing description and accompanying drawings. Accordingly, the present invention is to be limited solely by the scope of the following claims.

We claim:

1. An integrated circuit device comprising:
   a substrate layer of a first conductivity type;
   a drift layer of an opposite conductivity type having a selected first charge density and overlying said substrate layer;
   a buried layer of said opposite conductivity type situated between said substrate and drift layers;
   a gate electrode insulatingly spaced from said drift layer;
   a threshold implant region of said opposite conductivity type extending from the upper surface of said drift layer and underlying said gate electrode; and
   a sink implant region of said first conductivity type located adjacent to said gate electrode,
   wherein said buried layer underlies said sink implant layer and a portion of said threshold implant region so as to prevent punch through between said substrate layer and said sink implant region, said portion of said threshold implant region being less than all of said threshold implant region.

2. The integrated circuit device of claim 1 further comprising:
   a source region of said opposite conductivity type extending from the upper surface of said drift layer to said buried layer, said sink implant region lying between said source region and said threshold implant region;
   means for biasing said sink implant region to a potential substantially equal to the potential of said gate electrode; and
   a drain region of said opposite conductivity type extending from an upper surface of said drift layer.

3. An integrated circuit device comprising
   a substrate layer of a first conductivity type;
   a drift layer of an opposite conductivity type having a selected first charge density and overlying said substrate layer;
   a buried layer of said opposite conductivity type situated between said substrate and drift layers;
   a gate electrode insulatingly spaced from said drift layer;
   a threshold implant region of said opposite conductivity type extending from the upper surface of said drift layer and underlying said gate electrode; and
   a sink implant region of said first conductivity type located adjacent to said gate electrode,
   wherein said buried layer underlies said sink implant layer and a portion of said threshold implant region so as to prevent punch through between said substrate layer and said sink implant region;
   said integrated circuit device further comprising:
   a source region of said opposite conductivity type extending from the upper surface of said drift layer to said buried layer, said sink implant region lying between said source region and said threshold implant region;
   means for biasing said sink implant region to a potential substantially equal to the potential of said gate electrode;
   a drain region of said opposite conductivity type extending from an upper surface of said drift layer; and
   a lateral charge control region of said opposite conductivity type extending from the upper surface of said drift layer and connecting said drain region with said threshold implant region.

4. An integrated circuit device comprising
   a substrate layer of a first conductivity type;
   a drift layer of an opposite conductivity type having a selected first charge density and overlying said substrate layer;
   a buried layer of said opposite conductivity type situated between said substrate and drift layers;
   a gate electrode insulatingly spaced from said drift layer;
   a threshold implant region of said opposite conductivity type extending from the upper surface of said drift layer and underlying said gate electrode; and
   a sink implant region of said first conductivity type located adjacent to said gate electrode,
   wherein said buried layer underlies said sink implant layer and a portion of said threshold implant region so as to prevent punch through between said substrate layer and said sink implant region,
   said integrated circuit device further comprising:
   a source region of said opposite conductivity type extending from the upper surface of said drift layer to said buried layer, said sink implant region lying between said source region and said threshold implant region;
   means for biasing said sink implant region to a potential substantially equal to the potential of said gate electrode; and
   a drain region of said opposite conductivity type extending from an upper surface of said drift layer, wherein said sink implant region forms a loop around said source region and wherein said threshold implant regions and gate electrode each forms a loop around said sink implant region and said source region.

5. The integrated circuit device of claim 4 wherein other integrated circuit components are fabricated on the same substrate and drift layers and wherein said integrated circuit further comprises an isolation region of said first conductivity type extending from the surface of said drift layer to said substrate layer, said isolation region forming a boundary separating said integrated circuit from other components fabricated on said substrate layer.

6. An integrated circuit device comprising
   a substrate layer of a first conductivity type;
   a drift layer of an opposite conductivity type having a selected first charge density and overlying said substrate layer;
   a buried layer of said opposite conductivity type situated between said substrate and drift layers;

a gate electrode insulatingly spaced from said drift layer;
a threshold implant region of said opposite conductivity type extending from the upper surface of said drift layer and underlying said gate electrode; and
a sink implant region of said first conductivity type located adjacent to said gate electrode,
wherein said buried layer underlies said sink implant layer and a portion of said threshold implant region so as to prevent punch through between said substrate layer and said sink implant region, wherein said integrated circuit further comprises an emitter region of said opposite conductivity, said emitter region extending from the surface of said drift layer into said sink region, wherein said sink region is biased to substantially the same potential as said gate electrode and a collector region.

7. The integrated circuit device of claim 6 further comprising a lateral charge control region of said opposite conductivity type extending from the upper surface of said drift layer and connecting said collector region with said threshold implant region.

* * * * *